US006411007B1

(12) United States Patent
King et al.

(10) Patent No.: US 6,411,007 B1
(45) Date of Patent: Jun. 25, 2002

(54) CHEMICAL VAPOR DEPOSITION TECHNIQUES AND RELATED METHODS FOR MANUFACTURING MICROMINIATURE THERMIONIC CONVERTERS

(75) Inventors: Donald B. King, Albuquerque, NM (US); Laurence P. Sadwick, Salt Lake City, UT (US); Bernard R. Wernsman, Clairton, PA (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/895,372

(22) Filed: Jun. 28, 2001

Related U.S. Application Data

(63) Continuation-in-part of application No. 09/257,335, filed on Feb. 25, 1999, now Pat. No. 6,294,858.

(60) Provisional application No. 60/076,010, filed on Feb. 26, 1998.

(51) Int. Cl.$^{7}$ .......................... H02N 3/00; H01L 31/0224; H01L 37/00

(52) U.S. Cl. .......................... 310/306; 136/254

(58) Field of Search .......................... 310/306; 136/254; 164/104.23

(56) References Cited

U.S. PATENT DOCUMENTS

| | | | | |
|---|---|---|---|---|
| 3,218,196 A | * | 11/1965 | Jensen et al. | 136/254 |
| 4,359,663 A | * | 11/1982 | Shinoda et al. | 313/582 |
| 5,675,972 A | * | 10/1997 | Edelson | 313/310 |
| 5,973,259 A | * | 10/1999 | Edelson | 136/254 |
| 5,994,638 A | | 11/1999 | Edelson | 136/205 |
| 6,064,137 A | * | 5/2000 | Cox | 310/306 |
| 6,229,083 B1 | | 5/2001 | Edelson | 136/201 |
| 6,294,858 B1 | * | 9/2001 | King et al. | 310/306 |

OTHER PUBLICATIONS

King, et al. "Thermionic Modules," pending patent application filed Jun. 28, 2001, incorporated by reference.

King, et al. "Microminiature Thermionic Converters," pending patent application filed Jun. 28, 2001, incorporated by reference.

Zavadil, et al. "Low Work Function Materials for Microminiature Energy Conversion and Recovery Applications," pending patent application filed Jun. 28, 2001, Ser. No. 09/257,336, incorporated by reference.

* cited by examiner

*Primary Examiner*—Thomas M. Dougherty
(74) *Attorney, Agent, or Firm*—Russell D. Elliott

(57) ABSTRACT

Methods of manufacturing microminiature thermionic converters (MTCs) having high energy-conversion efficiencies and variable operating temperatures using MEMS manufacturing techniques including chemical vapor deposition. The MTCs made using the methods of the invention incorporate cathode to anode spacing of about 1 micron or less and use cathode and anode materials having work functions ranging from about 1 eV to about 3 eV. The MTCs also exhibit maximum efficiencies of just under 30%, and thousands of the devices can be fabricated at modest costs.

8 Claims, 6 Drawing Sheets

CHEMICAL VAPOR DEPOSITION TECHNIQUES AND RELATED METHODS FOR MANUFACTURING MICROMINIATURE THERMIONIC CONVERTERS

This application is a continuation-in-part of application Ser. No. 09/257,335, now US Pat. No. 6,294,858 filed Feb. 25, 1999, which in turn claimed the benefit of U.S. Provisional Application No. 60/076,010, filed Feb. 26, 1998, both of which are herein incorporated by reference in their entirety. Various other patent applications are likewise herein incorporated in their entirety, as noted elsewhere in this disclosure.

This invention was made with support from the United States Government under Contract DE-AC04-96AL85000 awarded by the U.S. Department of Energy. The Government has certain rights in this invention.

BACKGROUND OF THE INVENTION

1. Field of the Invention

This invention pertains to methods for manufacture of microminiature thermionic converters having high energy-conversion efficiencies and variable operating temperatures, using semiconductor integrated circuit fabrication and micromachine manufacturing techniques. The microminiature thermionic converters (MTCs) manufactured using the methods of the invention incorporate cathode to anode spacing of about 10 microns or less and use cathode and anode materials having work functions ranging from about 1 eV to about 3 eV.

2. Description of the Related Art

Thermionic conversion has been studied since the late nineteenth century, but practical devices were not demonstrated until the mid-twentieth century. Thomas Edison first studied thermionic emission in 1883 but its use for conversion of heat to electricity was not proposed until 1915 by Schicter. Although analytical work on thermionic converters continued during the 1920's, experimental converters were not reported until 1941. The Russians, Gurtovy and Kovalenko, published data which demonstrated the use of a cesium vapor diode to convert heat into electrical energy. Practical thermionic conversion was demonstrated in 1957 by Herqvist in which efficiencies of 5–10% were reached with power densities of 3–10 W/cm$^2$.

FIG. 1 illustrates the components and processes of a typical thermionic converter employing technology understood and applied prior to the present invention. A heat source 15 elevates the temperature of the emitter electrode 10 (typically, between 1400–2200 K). Electrons 50 are then thermally evaporated into the space, or interelectrode gap (IEG) 5, between the emitter electrode 10 and collector electrode 20. The electrodes are operated in a vacuum, near vacuum, or in low pressure vapor (less than several torr) 65 within a vacuum or rarefied vapor enclosure 60. The collector electrode 20 is cooled by a heat sink 25 and kept at a low temperature. The electrons 50 travel across the IEG 5 toward the collector electrode 20 and condense on the collector electrode 20. The electrons 50 then return to the emitter electrode 10 through the electrical leads 30, electrical terminals 35 and load 40 which connect the collector to the emitter. The figure shows an example configuration wherein the rarefied enclosure 60, itself, functions as a conduit of heat addition on one side and heat removal on the other. Alternatively, it is possible for the heat source and heat sink to be positioned inside enclosure 60 and function independently from it.

Thermionic emission depends on emission of electrons from a hot surface. Valence electrons at room temperature within a metal are free to move within the atomic lattice but very few can escape from the metal surface. The electrons are prevented from escaping by the electrostatic image force between the electron and the metal surface. The heat from the emitting surface gives the electrons sufficient energy to overcome the electrostatic image force. The energy required to leave the metal surface is referred to as the material work function, ø. The rate at which electrons leave the metal surface is given by the Richardson-Dushman equation:

$$J=AT^2\exp(-e\phi/kT),$$

where A is a universal constant, T is the emitter temperature, k is the Boltzmann constant, and ø is the emitter work function. Large emission current densities are achieved by choosing an emitter with low work function and operating that emitter at as high a temperature as possible, with the following limitations. Very high temperature operation may cause any material to evaporate rapidly and limit emitter lifetime. Low work function materials can have relatively high evaporation rates and must be operated at lower temperatures. Materials with low evaporation rates usually have high work functions.

Choosing the correct electrode material is a key component of designing functional thermionic converters. A general description of suitable materials is presented here in association with disclosing the principles of the converters of the present invention. Example materials suitable for the microminiature thermionic converters of the present invention and others (as well as methods for making them) are disclosed in a separate patent application (Ser. No. 09/257, 336). That separate patent application is incorporated herein in its entirety. (Other patent applications that are likewise incorporated herein in their entirety are [Attorney Docket Number SD-5987.2 and Attorney Docket Number SD-5987.4].)

Once the electrons are successfully emitted, their continued travel to the collector must be ensured. Electrons that are emitted from the emitter produce a space charge in the IEG. For large currents, the buildup of charge will act to repel further emission of electrons and limit the efficiency of the converter. Two options have been considered to limit space charge effects in the IEG: thermionic converters with small interelectrode gap spacing (the close-spaced vacuum converter) and thermionic converters filled with ionized gas.

Thermionic converters with gas in the IEG are designed to operate with ionized species of the gas. Cesium vapor is the gas most commonly used. Cesium has a dual role in thermionic converters: 1) space charge neutralization and 2) electrode work function modification. In the latter case, cesium atoms adsorb onto the emitter and collector surfaces. The adsorption of the atoms onto the electrode surfaces results in a decrease of the emitter and collector work functions, allowing greater electron emission from the hot emitter. Space charge neutralization occurs via two mechanisms: 1) surface ionization and 2) volumetric ionization. Surface ionization occurs when a cesium atom comes into contact with the emitter. Volumetric ionization occurs when an emitted electron inelastically collides with a Cs atom in the IEG. The work function and space charge reduction increase the converter power output. However, at the cesium pressures necessary to substantially affect the electrode work functions, an excessive amount of collisions (more than that needed for ionizations) occurs between the emitted electrons and cesium atoms, resulting in a loss of conversion efficiency. Therefore, the cesium vapor pressure must be controlled so that the work function reduction and space charge reduction effects outweigh the electron-cesium collision effect. An example of an operational thermionic converter is that found on the Russian TOPAZ-II space reactor. These converters operate at the emitter temperatures of 1700 K and collector temperatures of 600 K with cesium pressure in the IEG of just under one torr. Typical current densities achieved are <4 amps/cm$^2$ at output voltages of approximately 0.5 V. These converters operate at an efficiency of approximately 6%. The control of cesium pressure in the IEG is critical to operating these thermionic converters at their optimum efficiency.

A variety of thermionic converters are disclosed in the literature, including close-spaced converters. (See: Y. V. Nikolaev, et al., "Close-Spaced Thermionic Converters for Power Systems", Proceedings Thermionic Energy Conversion Specialists Conference (1993); G. O. Fitzpatrick, et al., "Demonstration of Close-Spaced Thermionic Converters", 28$^{th}$ Intersociety Energy Conversion Engineering Conference (1993); Kucherov, R. Ya., et al., "Closed Space Thermionic Converter with Isothermic Electrodes", 29th Intersociety Energy Conversion Engineering Conference (1994); and G. O. Fitzpatrick, et al., "Close-Spaced Thermionic Converters with Active Spacing Control and Heat-Pipe Isothermal Emitters", 31$^{st}$ Intersociety Energy Conversion Engineering Conference (1996).) Previously demonstrated thermionic converters, however, have not been able to achieve the current densities and conversion efficiencies predicted for the present invention. Others' efforts in the field of close-space converters demonstrate that expense and difficulty arise as a result of separately manufacturing and assembling at close tolerances the converter components such as the emitter, collector and spacers. Additionally, the assembly process results in relatively large converters with spacing between the emitter and collector of up to several millimeters. A large gap spacing between the emitter and collector causes the energy conversion efficiency to drop dramatically, often necessitating Cs vapor systems even in converters otherwise designed to be "close-spaced." Such vapor systems are usually large and cumbersome, and precise control of Cs vapor pressures needed to maximize conversion efficiency (ensuring that space-charge reduction effects outweigh electron-Cs collision effect) is difficult.

Miniature thermionic converters without ionized positive vapor in the IEG offer the simplest solution to thermionic energy conversion. The small IEG size itself reduces the density of electrons in the gap (and their resulting current limiting space charge). As alluded to above, the close-spaced converter has historically been difficult to manufacture for large-scale operation due to the close tolerances (several microns or even submicron interelectrode gap size) needed for efficient operation. As demonstrated below, however, large scale production and operation of these close-spaced converters is now possible using IC fabrication techniques according to the principles of the present invention. Spacings on the order of 0.25 microns can now be produced and maintained over relatively large emission areas. Also, the development of low work function electrodes eliminates the need for gas adsorption to lower the electrode work functions.

The MTC has application both in government and in industry. MTCs could be retrofitted into almost any system requiring energy conversion from heat to electricity. MTCs are suitable for use in satellite and deep space missions where conventional thermionics alone and in conjunction with radioisotope thermal generators are currently used or planned. Increasing the efficiency of current fossil fuel plants and systems as well as introducing new technologies for increasing the efficiency an utility of renewable energy supplies such as solar would help to reduce U.S. dependency on fossil fuel consumption. Combustion heated MTCs could be used for high efficiency conversion of heat to electricity as stand alone units or as part of topping cycle or bottoming cycle cogeneration systems in larger central power plants. They are also suited to use in the new smaller gas fired combined-cycle plants that utilities are building to meet peak power demands. At lower power scales (typically less than 125 kWe), MTCs could prove to be more economical than conventional cogeneration systems using machinery with moving parts. Smaller mechanical systems have shown increased operating costs due to increased maintenance requirements. Very small MTC units (1–50 kWe) could be used with home heating systems (furnaces and water heaters) and small businesses to feed electricity back into the home/business or its community electric grid. MTCs could also be used with solar concentrators or central receiver power towers to generate electricity as stand alone units or in conjunction with other conversion technologies. These applications could by linked to an existing power grid or be deployed in any undeveloped region without a grid (eliminating the need in those areas for developing an expensive electric power grid).

SUMMARY OF THE INVENTION

Accordingly, to provide a method of manufacturing MTCs and MTC components monolithically using IC fabrication and micromachine manufacturing techniques.

This and other objects of the present invention are fulfilled by the claimed invention which utilizes integrated circuit (IC) fabrication methods and micromachine manufacturing (MM) techniques to provide a class of close-space thermionic converters demonstrating relatively large current densities and relatively high conversion efficiencies as compared with thermionic converters that are presently available.

Advantages and novel features will become apparent to those skilled in the art upon examination of the following description or may be learned by practice of the invention. The objects and advantages of the invention may be realized and attained by means of the instrumentalities and combinations particularly pointed out in the appended claims.

DESCRIPTION OF THE FIGURES

The accompanying drawings, which are incorporated into and form part of the specification, illustrate embodiments of the invention and, together with the description, serve to explain the principles of the invention.

DETAILED DESCRIPTION OF THE INVENTION

As suggested above, planar thermionic diodes can be manufactured using IC fabrication techniques slightly modified as disclosed herein to accomplish the objectives of the invention. All elements of the diode (emitter, collector, and insulating spacer between the electrodes) can be made using standard chemical vapor deposition (CVD) techniques and etch techniques used by the semiconductor industry. The CVD techniques allow for reliable, reproducible and accurate growth of extremely thin layers of metals (for the electrodes) and oxides (for some electrodes and for the spacers).

MTCs can be fabricated with gap spaces ranging from 0.1 to 10 microns. With IEGs of this size, gases such as Cs vapor need not be introduced into the gap to reduce the space charge effects resulting from the large current flow from the emitter to the collector. The small gap size itself reduces the density of electrons in the gap.

Existing thermionic converter technology employs use of refractory metals such as tungsten or molybdenum to fabricate the emitter and collector electrodes. These materials have high work functions that, in turn, require higher emitter temperatures. The MTCs of the present invention, conversely, use low work function materials that can be selected on the basis of performance criteria, and desired temperature of operation. Examples of such low work function materials that are suitable for MTC electrodes and compatible with the IC-style fabrication techniques used in the present invention include BaO, SrO, CaO, and $Sc_2O_3$. In all cases, for thermionic conversion to occur, the work function of the collector electrode must not exceed that of the emitter electrode. Additionally, as noted above, one example of a class of suitable low work function materials, is disclosed in U.S. patent application 09/257,336 which, as noted previously, is herein incorporated by reference. This class of materials includes a mixture of BaSrCaO, $Sc_2O_3$ and metal such as W.

Various dielectric materials for separation of the electrodes are likewise suited both to the IC fabrication techniques and to application as spacers in MTCs. Among these are included $SiO_2$ and $Si_3N_4$. As shown below, in certain embodiments, the insulator material itself may serve as an appropriate substrate onto which the electrodes can be deposited using CVD.

Figure 1:
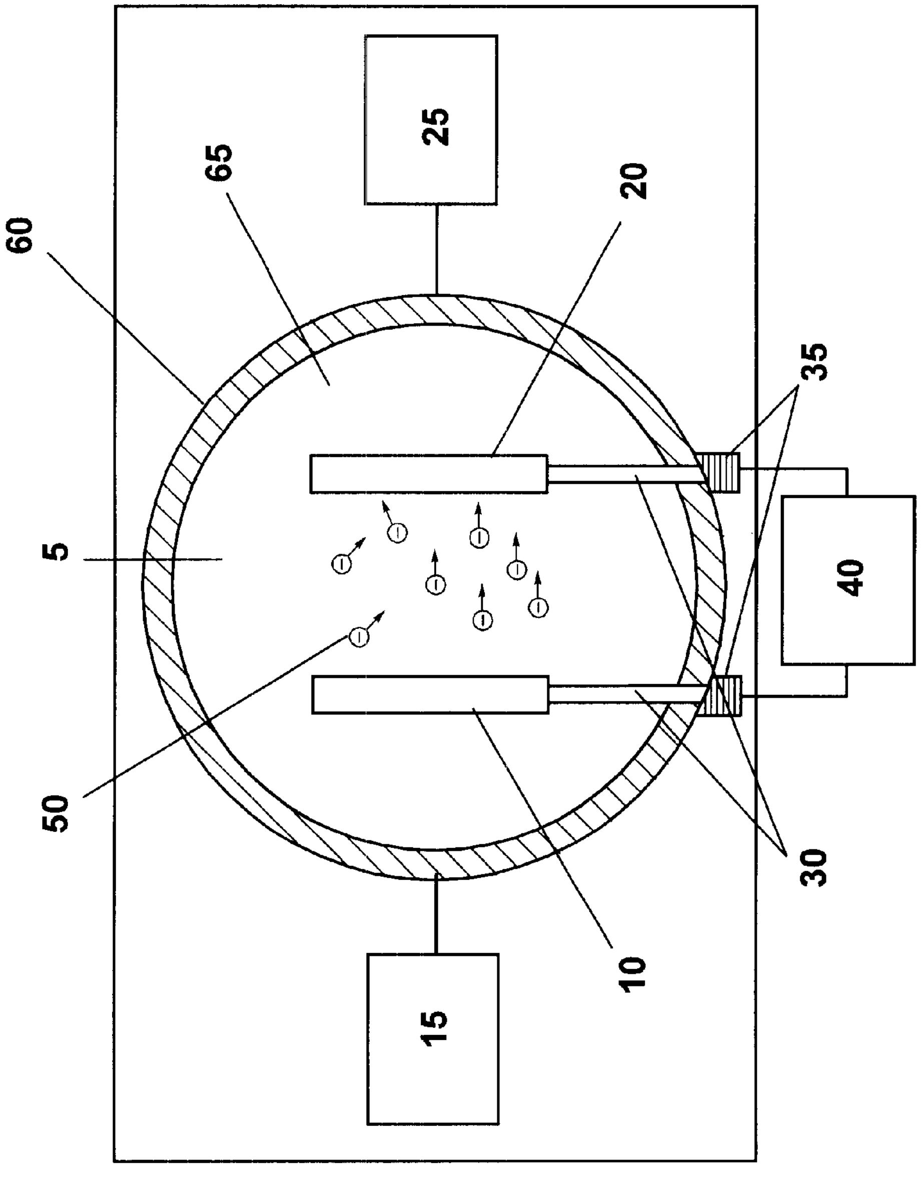
Figure 1 (Prior Art)
FIG. 1 is a schematic illustration of elements in a typical thermionic converter (prior art).
Figure 2:
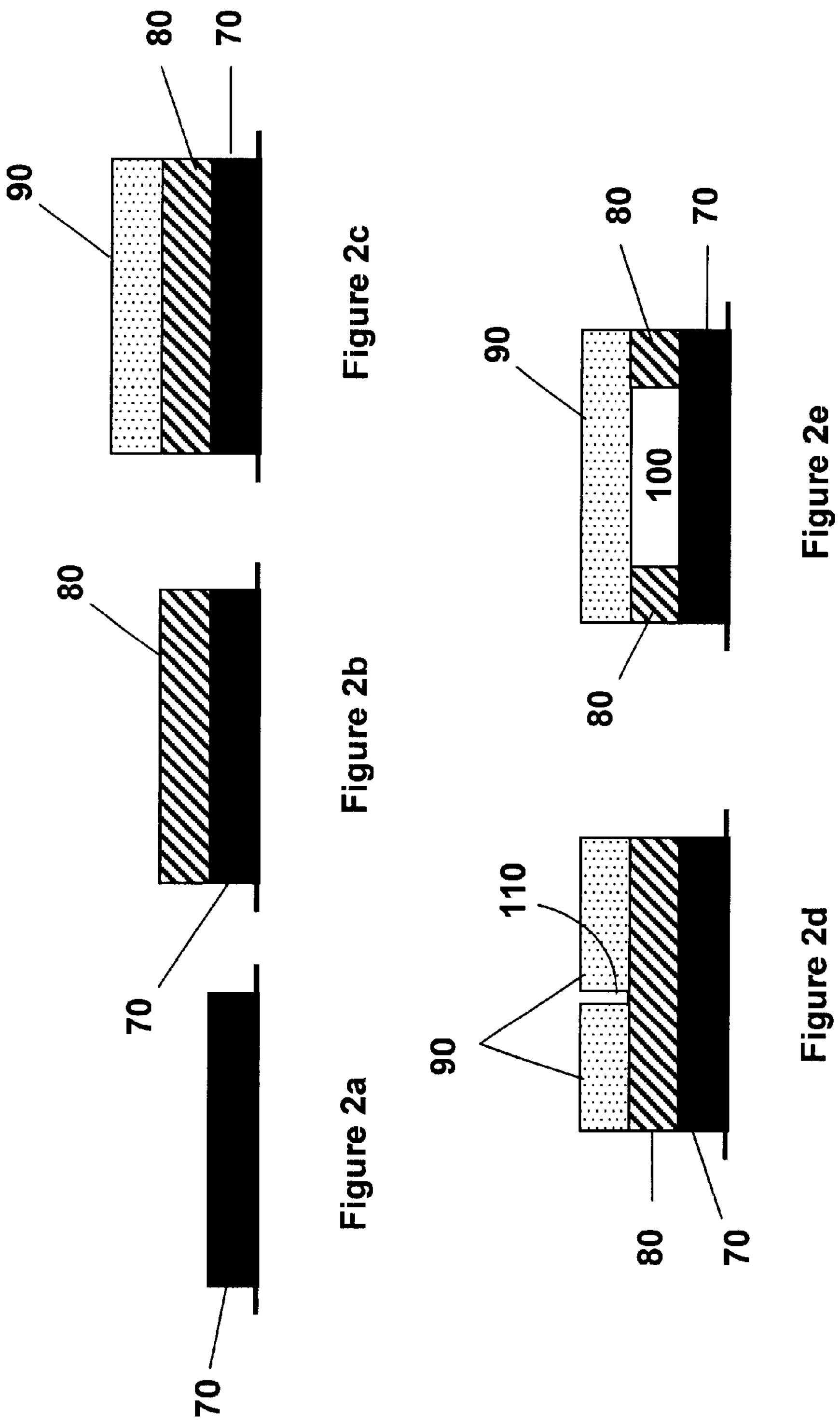
FIGS. 2*a* through 2*e* show schematically the arrangement of elements in a MTC fabricated using one embodiment of the invention.

FIG. 2 illustrates the general concept by which an MTC could be fabricated according to one embodiment of the invention. In this embodiment, CVD techniques are used to deposit various layers of material of which the elements of the thermionic converter are comprised. FIG. 2*a* shows a deposited substrate or first electrode layer 70, which could form either the emitter or the collector in a finished MTC. This could be any low work function material appropriate for the desired application. As indicated above, materials such as BaO, SrO, CaO, $Sc_2O_3$ or a mixture of BaSrCaO, $Sc_2O_3$ and metal such as W for example, may be suitable. Likewise, a combination of these materials may be appropriate for given applications. It is also noted that the first electrode layer 70 could represent some combination of metal electrode and low work function material, or even some combination of a thermally and/or electrically insulating substrate with metal and low work function material on its surface. Variations of this sort will be known to those skilled in the art and are considered to be within the scope of the appended claims. In FIG. 2*b*, an oxide spacer 80 is then deposited on the first electrode layer 70. The depth of the spacer 80 serves to define the distance between the collector and emitter (the interelectrode gap) in the completed MTC.

The next step in this embodiment, FIG. 2*c*, is to deposit another electrode layer 90 on top of the oxide spacer 80 layer. This second electrode layer 90 must be of a material having a work function that is different from that of the first electrode layer. (As with the first electrode layer 70, the second electrode layer 90 could include a combination of metal electrode and low work function material, or some combination of a thermally and/or electrically insulating substrate with metal and low work function material on its surface. (Again, variations of this sort will be known to those skilled in the art and are considered to be within the scope of the appended claims.) Again, in the completed MTC, the electrode layer having the higher work function will serve as the emitter and the electrode layer having the lower work function will be the collector.

FIGS. 2*d* and 2*e* illustrate the creation of the interelectrode gap, or IEG 100. This can be accomplished by various means known to those skilled in the arts of chemical vapor deposition and integrated circuit fabrication. Those means may include, but are not limited to, masking the electrodes and spacers and then etching out an IEG region 100 of desired dimensions between the two electrode layers using suitable etchants, or sputtering particles to disrupt the crystal structure in the spacer layer 80 thereby creating a hole to serve as the IEG 100. The size of the IEG 100 is in the range of 0.1 to 10 microns between the first electrode layer 70 and the second electrode layer 90. FIG. 2*d* shows how one or more etching vias 110 might serve to assist in making the IEG 100.

FIGS. 3*a* through 3*d* show an alternative embodiment wherein the MTC is manufactured using at least two separate substrate elements which can be subsequently assembled resulting in the completed MTC. Due to the precision of the IC fabrication methods used in making the various components of MTCs, and because only a small number of separate elements are required, the problems alluded to in the background section of this disclosure with regard to assembly of prior art macro-sized close-space thermionic converters are averted when manufacturing MTCs. Benefits of using the design of this embodiment of the invention include easy customization in terms of size, shape and electrical characteristics for use in building banks of MTC to accommodate different power requirements. This embodiment also incorporates use of metal conductors deposited separately from the emitter and collector electrode materials, likewise offering flexibility in design.

Figure 3:
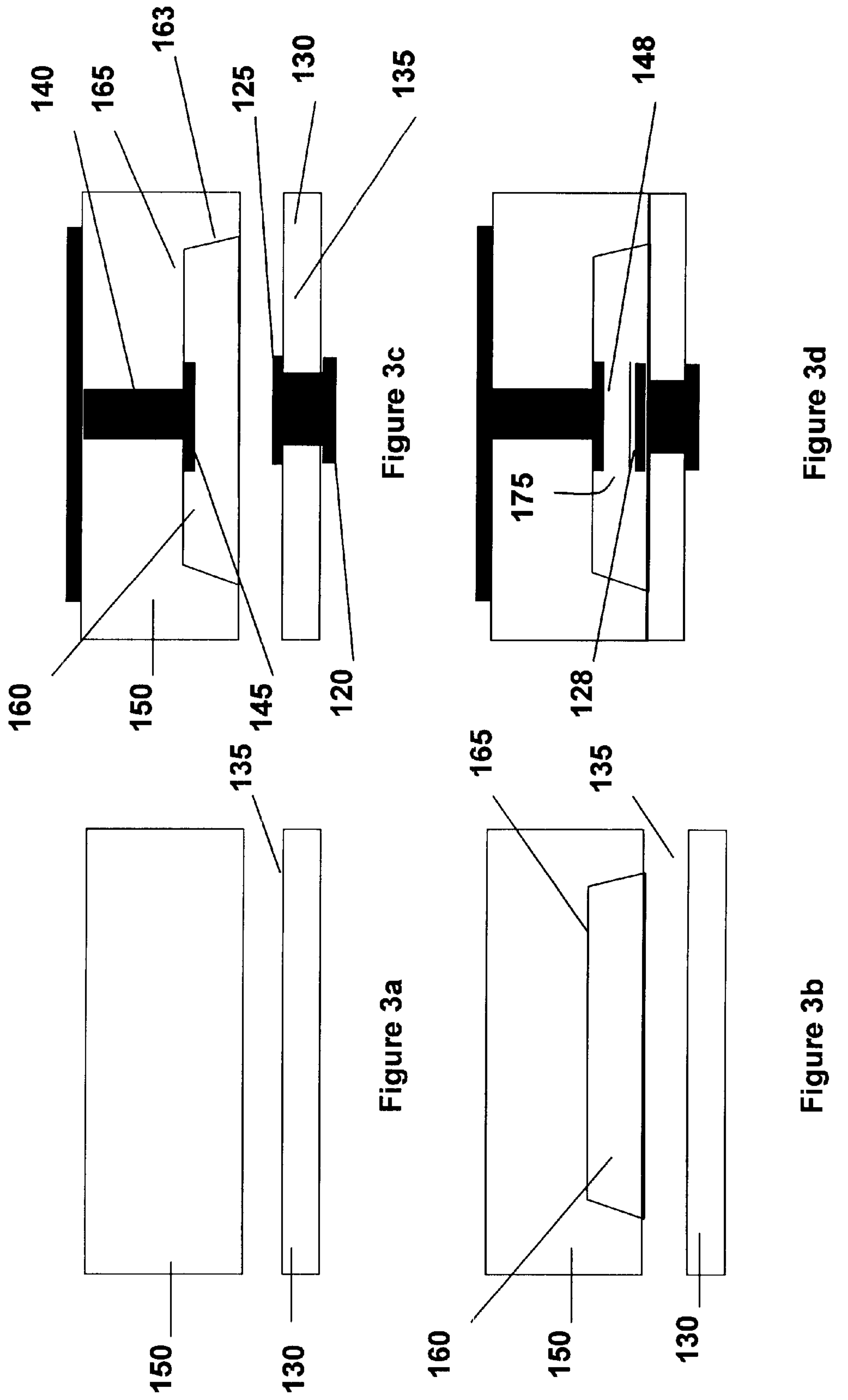
FIGS. 3*a* through 3*d* show schematically the arrangement of elements in a MTC fcated using another embodiment of the invention.

Referring to FIG. 3*a*, a first substrate 130 comprising a dielectric and having a substantially flat surface 135 is deposited or otherwise provided. A second substrate 150 is deposited or otherwise provided separately from the first substrate. This second substrate 150 may be comprised of a dielectric or semiconductor, depending on the design requirements of the MTC to be constructed.

FIG. 3*b* shows where a recess or opening 160 is created in the second substrate 150 using any of any of a variety of techniques such as etching or sputtering as previously described for creating the IEG 100 illustrated in FIG. 2(*e*). The opening 160 has a substantially planar boundary 165 along one dimension which will lie substantially parallel to the substantially flat surface 135 of the first substrate 130 in the completed MTC. The opening also includes at least one wall 163. The reason this element is described as at least one wall is that functional embodiments could include various instances including the following: 1) use of separate and distinct walls (such as in the case where multiple walls define a geometrically angular opening), or 2) use of a single curved wall (such as in the case of a circle or oval). These and other modifications in the wall configuration are considered to be a matter of choice and within the understanding of those skilled in the art.

FIG. 3*c* illustrates where a first conductor 120 has been deposited in the first substrate 130. This conductor is comprised of metal or another electrically conducting material suited to deposition using semiconductor manufacturing techniques known to those skilled in the art. The first conductor 120 includes a surface 125 disposed adjacent to, and in a plane substantially parallel to, the substantially flat surface 135 of the first substrate 130. Also shown in FIG. 3*c* is a second conductor 140, which is deposited within the second substrate 150. As with the first conductor 120, the second conductor 140 is comprised of metal or another electrically conducting material suited to deposition using semiconductor manufacturing techniques known to those skilled in the art. The second conductor 140 likewise includes a surface 145, however, in this case the surface 145 is disposed adjacent to, and in a plane substantially parallel to, the substantially planar boundary 165 of the opening 160 in the second substrate 150.

FIG. 3*d* shows a completed MTC wherein the first substrate 130 is assembled to the second substrate 150 so that the surface 125 of the first conductor 120 is aligned substantially parallel to the surface 145 of the second conductor 140. Deposited on the surface 125 of the first conductor is a first electrode material 128 having a given work function. Deposited on the surface 145 of the second conductor is a second electrode material 148 having a given work function which is different from that of the first electrode material 128. An interelectrode gap (IEG) 175 is disposed therebetween. As with the earlier described embodiment, the size of the IEG 175 should be in the range of 0.1 to 10 microns between the first electrode material 128 and the second electrode material 128. Choice of the exact size of the IEG as well as what specific low work function materials to use for electrodes will depend on the requirements for any particular MTC. Potentially suitable electrode materials, for the reasons stated above, include BaO, SrO, CaO, and $Sc_2O_3$, however, in all cases, the electrode material which serves to collect electrons in the MTC cannot have a work function greater than the electrode material of the electron emitter in the MTC diode. Given the specific requirements of a given MTC, it may be desirable for the anode and cathode to be treated with the same electrode material.

It should be noted that the embodiment illustrated in FIGS. 3*a* though 3*d* can be modified as needed to accommodate specifications or manufacturing constraints. For example, the boundary 165 of the gap 160 etched in the second substrate 150 and the surface 135 of the first substrate need not necessarily be flat and disposed parallel to one another so long as the coated surfaces 128, 148 of the first and second conductors 120, 140 are substantially flat and disposed parallel to each other. Maximum efficiency of an MTC depends on the anode and cathode in the diode being the same distance apart at all points along the emitting and collecting surfaces.

Efficiency of a thermionic converter is inversely proportional to thermal conductivity losses between the higher temperature electrode (cathode) and the lower temperature electrode (anode) according to the following relationship:

$$\eta \propto \frac{W_e}{W_T} \qquad \text{(Equation 1)}$$

where η is efficiency of the thermionic converter, $W_e$ is watts generated as a result of thermionic conversion, and $W_T$ is watts lost due to thermal conductivity (and other losses such as radiation losses between the emitter and the collector). As noted in this disclosure various structural features may function according to the invention to maintain separation between the cathode and anode in an MTC. For purposes of the discussion of thermal losses in this section, those structural features are referred to as spacing elements, and include such features as the oxide spacers 80 shown in FIG. 2*e*, and the portion of the second substrate 150 that adjoins the first substrate 130 as shown in FIGS. 3C and 3D, as well as any and all other suitable structures functioning to maintain separation between electrodes in an MTC. The loss due to thermal conductivity of spacing elements between the electrodes in the MTC of the present invention can be described as:

$$W_{T(spacer)} = (A)(K)\left(\frac{T_H - T_L}{\Delta X}\right) \qquad \text{(Equation 2)}$$

where A is the summation of the cross sectional areas of the spacing elements, K is the thermal conductivity of the spacer material, $T_H - T_L$ is the difference in temperature between the higher temperature electrode and the lower temperature electrode, and ΔX is the distance between the higher temperature electrode and the lower temperature electrode (which also correlates to the average length of the spacing elements). An increase in the number of spacing elements in a thermionic converter likewise increases the total cross sectional area through which thermal losses can take place. So, therefore, in view of the relationships noted above, where the number of spacing elements is considered the only variable and otherwise identical conditions are assumed, a thermionic converter with a greater number of spacing elements has a lower thermionic efficiency than a thermionic converter having fewer spacing elements.

In the present invention, the spacing elements are designed and configured so as to minimize thermal losses. In particular, according to the invention, the number and size of spacing elements, including their cross-sectional area, are designed specifically so that watts generated as a result of thermionic conversion for a given MTC (having given characteristics of temperature, interelectrode distance, and spacer material conductivity) either exceed or greatly exceed watts lost due to thermal conductivity associated with spacing elements. In particular, for the MTCs of the present invention, the ratio of watts generated as a result of thermionic conversion to wafts lost due to thermal conductivity (including losses due to flow of thermal energy from the cathode to the anode via the spacing element or elements) can exceed about 0.05 or about 0.15, and can approach about 0.3. In one embodiment, that ratio is greater than 1. In another embodiment, that ratio is greater than 10. In another embodiment, that ratio is greater than 100. In another embodiment, that ratio is greater than 1000. Desired levels of efficiency can be attained using a single spacing element, two spacing elements or more than two spacing elements by application of the principles described in this and the preceding paragraph.

Operation of the completed MTC in all cases contemplated by this disclosure requires a temperature difference to exist between the emitter and the collector at the time the MTC is operated. In the best mode known to the inventors, satisfactory electric power generation with MTCs can be accomplished where the emitter temperature is approximately 300° C. higher than the collector temperature. This can be accomplished using any of a variety of methods of temperature regulation known to those skilled in the arts of thermionic conversion and integrated circuit manufacture, and includes use of such means as radiant heat sources for heating the emitter and heat sinks for cooling the collector.

Figures 4, 4A, 4B:
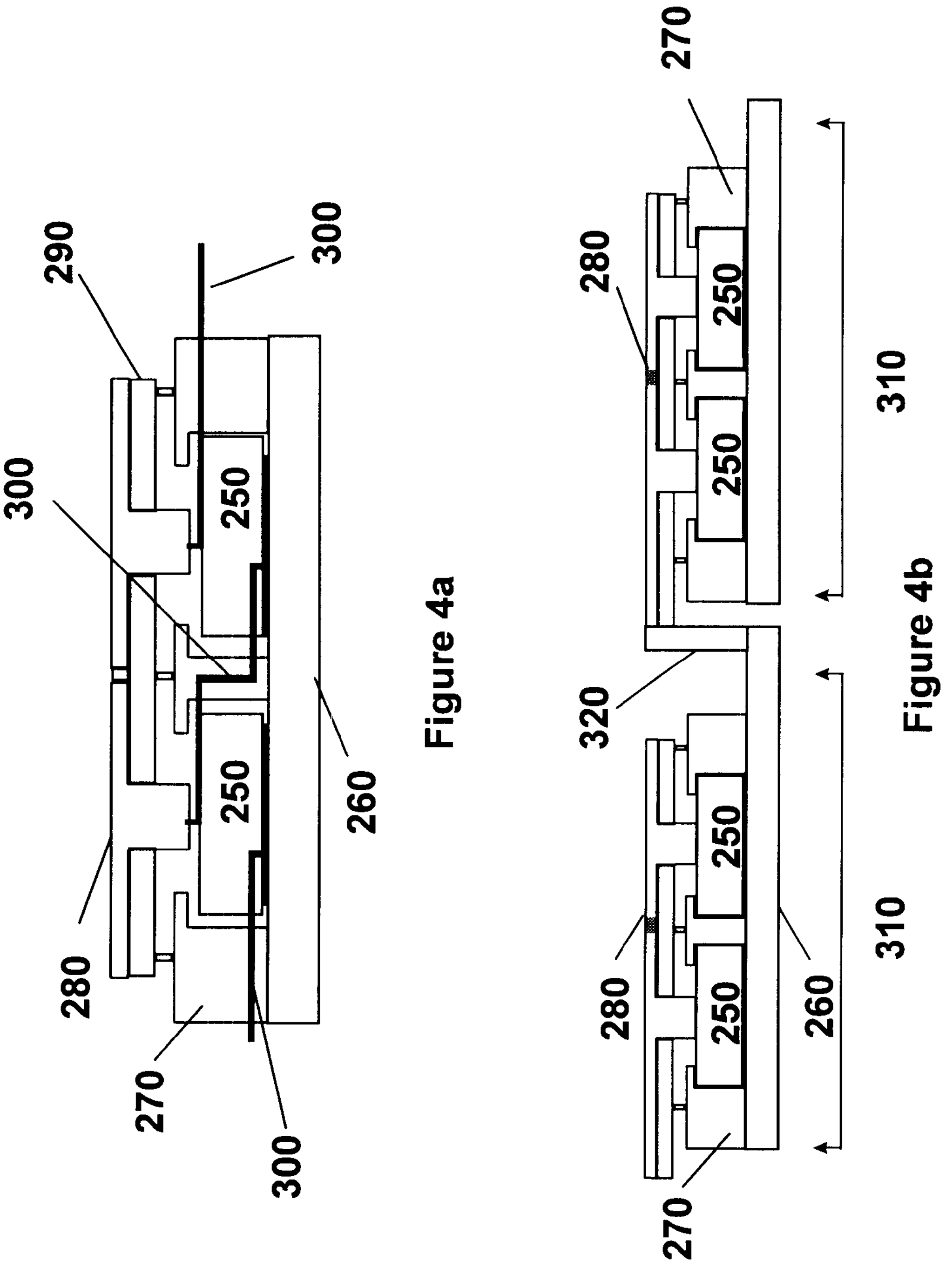
FIGS. 4*a* and 4*b* show schematically how banks of MTCs can be assembled.

FIG. 4*a* shows how multiple MTCs can be arranged in a bank in series. In the figure, two MTCs 250 are mounted atop a cold plate 260, and secured by collars 270. The cold plate serves to cool the collector electrodes of the MTCs 250. A radiator 280 supported by a radiator support 290 serves to heat the emitter electrodes of the MTCs 250. Electrical interconnects 300 between adjacent MTCs are shown in the figure as bold lines. FIG. 4*a* illustrates an electrical connection between the heated emitter of one MTC to the cooled collector of the adjacent MTC, thereby creating a series connection. FIG. 4*b* is similar except that it illustrates a first pair of MTCs 250 in parallel configuration 310 which, in turn, is joined by a series connection 320 to a second pair of MTCs 250 in parallel configuration 310. Thus, the MTCs of the present invention are scalable to a wide range of power levels though series and parallel connections.

Figure 5:
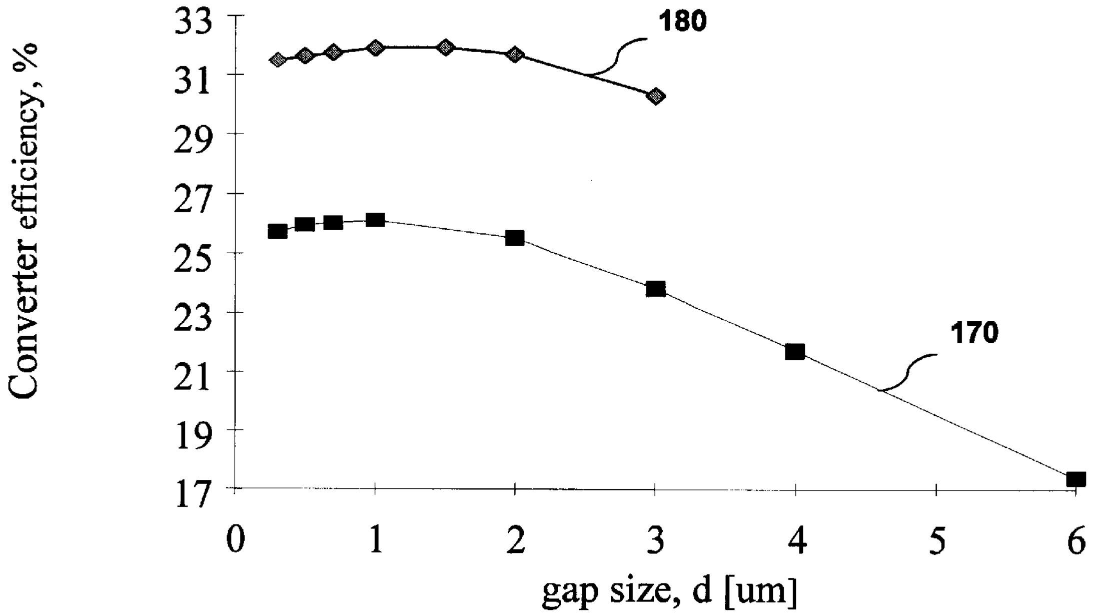
FIG. 5 shows a graph illustrating projected converter efficiency versus gap size.

The design and fabrication of MTCs is guided by modeling of the converter structures and materials as well as the physical processes. FIG. 5 illustrates the dependence of converter efficiency on gap size of the converter. Two emitter work functions (wfe) were selected: 1.6 and 2.2 eV. The upper curve 180 on the graph plots data for wfe=2.2 eV. The lower curve 170 on the graph plots data for wfe=1.6. For the 2.2 eV emitter, the emitter temperature, collector temperature, and collector work function were 1500 K, 673 K, and 1.5 eV, respectively. For the 1.6 eV emitter, the emitter temperature, collector temperature, and collector work function were 1100 K, 573 K, and 1 eV, respectively. For these two cases, efficiencies in the high 20% to low 30% were obtained. Maximum efficiencies occur in the 1-micron gap space range.

Figure 6:
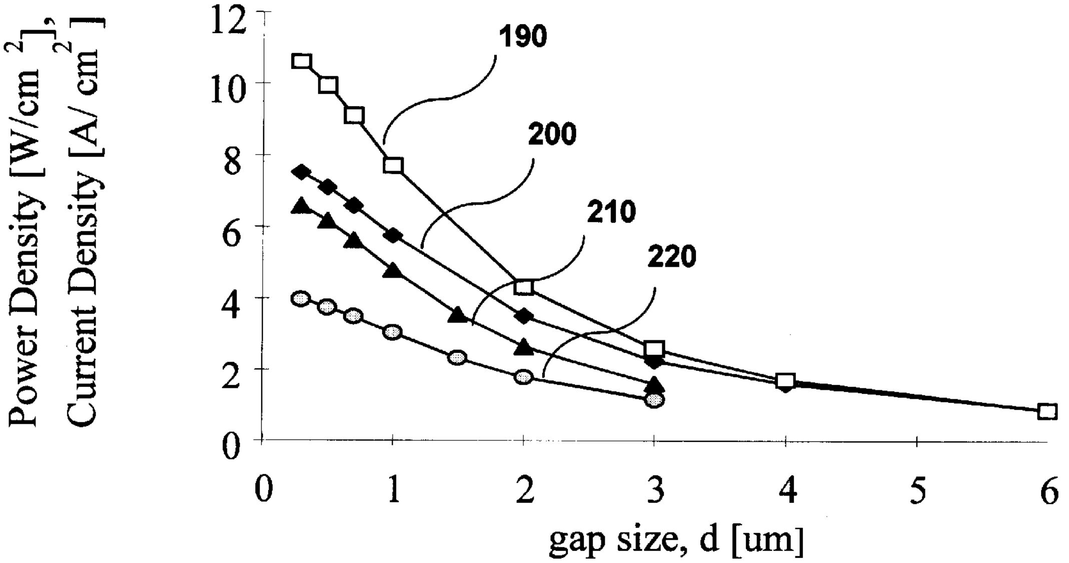
FIG. 6 shows a graph illustrating projected converter current and power density versus gap size.

FIG. 6 illustrates the power and current densities achieved by the cases shown in FIG. 5. Plot 190 shows power ($W/cm^2$), wfe=2.2 eV; plot 200 shows current ($A/cm^2$), wfe=2.2 eV; plot 210 shows power ($W/cm^2$), wfe=1.6 eV; and plot 220 shows current ($A/cm^2$), wfe=2.2 eV. Current densities in the 1 to 10 $A/cm^2$ range are readily attainable. Raising the emitter temperature or decreasing the gap size can increase current densities.

Figure 7:
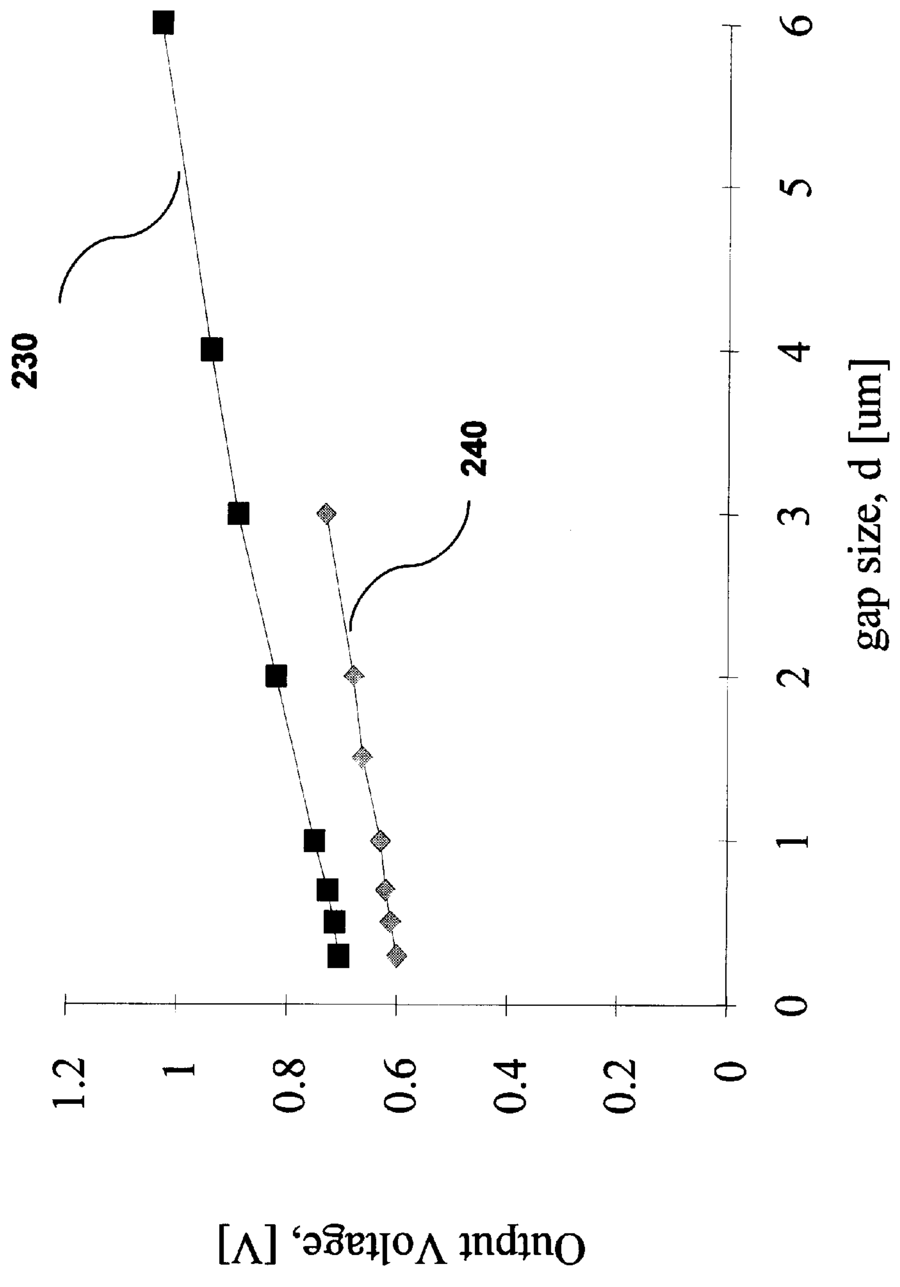
FIG. 7 shows a graph illustrating projected converter output voltage versus gap size.

FIG. 7 illustrates the output voltage that can be achieved versus gap size. Plot 230 shows data for wfe=2.2 eV and plot 240 shows data for wfe=1.6 eV. Output voltage increases as gap size is increased; however, current densities decrease as gap size increases. Larger output voltages can also be achieved by fabricating the miniature converters in series.

As has been discussed, the high conversion efficiency (about 30%) of MTCs and their inherent small size makes them suitable for radioisotope thermoelectric generators (RTGs). RTGs have been extensively used for space power systems such as that found on the Gallileo and Ulysses satellites. Currently, these RTGs can deliver at least 285 W of electrical power at an efficiency of about 6.5%. It is believed that MTCs could increase the output of RTGs to>1000 W of electrical power without modifying the design of the radioisotope module and without increasing the mass of the RTG.

Terrestrially, it is believed that MTCs could be used as portable power systems. Since energy conversion from these systems can be accomplished at relatively low temperatures (<1000 K), heat sources such as that found from burning kerosene, alcohol, wood, and similar fuels could be used. Therefore, a portable power generator that could be used for emergency power or camping, for example, could be made to fit in the trunk of a car.

The preliminary Heat Pipe Power System (HPS) Space Reactor is designed to provide 5 kWe power using 5% efficient unicouple thermoelectrics. Heat pipes provide heat to the thermoelectrics at 1275 K. The excess heat from the thermoelectrics is rejected at 775 K. MTC characteristics could be matched to the thermal operating conditions of the HTS to achieve higher conversion efficiencies. When operating at the temperature range mentioned above and with emitter and collector work functions of 1.6 eV and 1.0 eV, respectively, MTCs could provide energy conversion efficiencies of 25 to 34% for interelectrode gap sizes ranging from 1 to 3 microns. Output currents would range from 3 to 19 $A/Ncm^2$, and output power densities would range from 2.7 to 12.8 $W/cm^2$. Increasing efficiencies would also result in a less massive HPS by decreasing the size of the heat rejection radiator.

The invention being thus described, it will be obvious that the same may be varied in many ways. Such variations are not to be regarded as a departure from the spirit and scope of the invention, and all such modifications as would be obvious to one skilled in the art are intended to be included within the scope of the appended claims.

We claim:

1. A method for manufacturing microminiature thermionic converters comprising the steps of:

depositing a first electrode layer comprising a first material selected from the group consisting of BaO, SrO, CaO, $Sc_2O_3$, other oxides, and a mixture of BaSrCaO, $Sc_2O_3$ and metal, and any combinations thereof, and having a first work function;

depositing a dielectric oxide spacer layer;

depositing a second electrode layer comprising a second material selected from the group consisting of BaO, SrO, CaO, $Sc_2O_3$, other oxides, and a mixture of BaSrCaO, $Sc_2O_3$ and metal; and any combinations thereof having a second work function that is different from the first work function; and removing matter from the dielectric oxide spacer layer thereby forming an interelectrode gap.

2. The method of claim 1 wherein the dielectric oxide spacer layer comprises material selected from the group consisting of $SiO_2$ and $Si_3N_4$ and combinations thereof.

3. The method of claim 2 wherein the step of removing matter from the dielectric oxide spacer layer comprises a technique selected from the group consisting of steps comprising masking at least part of the first electrode layer, masking at least part of the second electrode layer, masking at least two parts of the spacer layer, and etching out an interelectrode gap bound on opposite sides by unetched portions of the spacer layer;

steps comprising sputtering particles to disrupt crystal structure in a part of the spacer layer thereby causing the crystal structure to disintegrate in that part of the spacer layer and leave an interelectrode gap; and steps comprising utilizing etching vias cut into at least one of the electrode layers to permit etchant to enter the spacer layer and remove a portion of the spacer layer between the first and second electrode layers, leaving an interelectrode gap.

4. The method of claim 3 wherein part of the spacer layer remains after removal of a portion of the spacer layer, and said part of the spacer layer remaining consists of no more than two separate spacing elements.

5. The method of claim 3 wherein part of the spacer layer remains after removal of a portion of the spacer layer, and said part of the spacer layer remaining consists of a plurality of spacing elements sufficiently few in number and of sufficiently low aggregate cross sectional area that, in a microminiature thermionic converter so manufactured, when operating, the ratio of watts of thermal conversion to watts of thermal conductivity losses, including losses resulting from flow of thermal energy between the first and second electrode layers via spacing elements, is greater than about 0.15.

6. A method of manufacturing microminiature thermionic converters comprising the steps of:

depositing a first substrate comprising a dielectric;

depositing a second substrate comprising material selected from the group consisting of dielectric and semiconductor;

forming in the second substrate a recess comprising at least one wall and a floor boundary;

depositing a first conductor having a substantially flat surface in the first substrate;

depositing a second conductor having a substantially flat surface in the second substrate so the substantially flat surface extends through the floor boundary and into the recess;

coating the first substantially flat surface with a first coating material;

coating the second substantially flat surface with a second coating material different from the first coating material;

assembling the first substrate and the second substrate together so that the first substantially flat surface and the second substantially flat surface are substantially parallel and opposite each other, with a space therebetween.

7. The method of claim 6 wherein the first coating material has a first work function and is selected from the group consisting of BaO, SrO, CaO, $Sc_2O_3$, and a mixture of BaSrCaO, $Sc_2O_3$ and metal, and any combinations thereof, and the second coating is different from the first coating and has a second work function different from the first work function.

8. The method of claim 7 wherein the second coating is selected from the group consisting of BaO, SrO, CaO, $Sc_2O_3$, and a mixture of BaSrCaO, $Sc_2O_3$ and metal, and any combinations thereof.

* * * * *